(12) United States Patent
Nomaru et al.

(10) Patent No.: US 10,504,783 B2
(45) Date of Patent: Dec. 10, 2019

(54) LASER PROCESSING APPARATUS

(71) Applicant: DISCO CORPORATION, Tokyo (JP)

(72) Inventors: Keiji Nomaru, Tokyo (JP); Yuji Hadano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/172,987

(22) Filed: Oct. 29, 2018

(65) Prior Publication Data

US 2019/0131173 A1 May 2, 2019

(30) Foreign Application Priority Data

Nov. 2, 2017 (JP) .................................. 2017-212466

(51) Int. Cl.
| | |
|---|---|
| *H01L 21/78* | (2006.01) |
| *B23K 26/0622* | (2014.01) |
| *B23K 26/40* | (2014.01) |
| *H01L 21/683* | (2006.01) |
| *B23K 26/14* | (2014.01) |
| *B23K 26/364* | (2014.01) |
| *B23K 101/40* | (2006.01) |
| *B23K 26/06* | (2014.01) |

(52) U.S. Cl.
CPC .......... *H01L 21/78* (2013.01); *B23K 26/0624* (2015.10); *B23K 26/1464* (2013.01); *B23K 26/364* (2015.10); *B23K 26/40* (2013.01); *H01L 21/6835* (2013.01); *B23K 26/0643* (2013.01); *B23K 2101/40* (2018.08); *H01L 2221/68327* (2013.01)

(58) Field of Classification Search
CPC ................. H01L 21/78; H01L 21/6835; H01L 2221/68327; B23K 26/364; B23K 26/1464; B23K 26/146; B23K 26/40; B23K 26/0624; B23K 26/1462; B23K 2101/40; B23K 26/0643
See application file for complete search history.

(56) References Cited

U.S. PATENT DOCUMENTS

| | | | | |
|---|---|---|---|---|
| 2019/0118292 A1* | 4/2019 | Nomaru | ................ | B23K 26/064 |
| 2019/0122907 A1* | 4/2019 | Hadano | ................ | B23K 26/364 |
| 2019/0126397 A1* | 5/2019 | Nomaru | ............ | B23K 26/1224 |

(Continued)

FOREIGN PATENT DOCUMENTS

| | | |
|---|---|---|
| JP | 10305420 A | 11/1998 |
| JP | 2002192370 A | 7/2002 |

(Continued)

*Primary Examiner* — John P. Dulka
(74) *Attorney, Agent, or Firm* — Greer Burns & Crain Ltd.

(57) ABSTRACT

A laser processing apparatus has a liquid supply mechanism disposed at an upper portion of a holding unit. The liquid supply mechanism includes: a pool adapted to form a layer of a liquid on an upper surface of a workpiece held by a holding table; a transparent plate disposed such as to make contact with the layer of the liquid; a jet nozzle adapted to jet the liquid by positioning a jet port between an upper surface of the workpiece and the transparent plate toward an application position of a laser beam applied to the workpiece through the transparent plate; a liquid supply nozzle adapted to supply the liquid from one side of the pool; and a liquid discharge nozzle adapted to discharge the liquid from the other side of the pool.

2 Claims, 5 Drawing Sheets

(56) References Cited

U.S. PATENT DOCUMENTS

| | | | |
|---|---|---|---|
| 2019/0131173 A1* | 5/2019 | Nomaru | B23K 26/1464 |
| 2019/0202008 A1* | 7/2019 | Buske | B23K 1/0056 |
| 2019/0232431 A1* | 8/2019 | Hadano | B23K 26/146 |
| 2019/0240777 A1* | 8/2019 | Kamigawara | B23K 26/144 |
| 2019/0247954 A1* | 8/2019 | Pahk | B23K 26/142 |

FOREIGN PATENT DOCUMENTS

| | | |
|---|---|---|
| JP | 2004188475 A | 7/2004 |
| JP | 2014221483 A | 11/2014 |

* cited by examiner

LASER PROCESSING APPARATUS

BACKGROUND OF THE INVENTION

Field of the Invention

The present invention relates to a laser processing apparatus for applying a laser beam to a plate-shaped workpiece to process the workpiece.

Description of the Related Art

A wafer having a plurality of devices such as integrated circuits (ICs) and large scale integrated circuits (LSIs) formed on a front surface thereof partitioned by a plurality of intersecting division lines (streets) is divided into individual device chips by a laser processing apparatus, and the divided device chips are used for electric apparatuses such as mobile phones, personal computers, and illumination apparatuses.

Examples of the laser processing apparatus include those of a type in which a laser beam of such a wavelength as to be absorbed in a workpiece is applied to the workpiece, with a focal point of the laser beam positioned on a surface of the workpiece, whereby grooves serving as starting points of division are formed by ablation (see, for example, Japanese Patent Laid-open No. 1998-305420), those of a type in which a laser beam of such a wavelength as to be transmitted through a workpiece is applied to the workpiece, with a focal point of the laser beam positioned in the inside of the workpiece, whereby modified layers serving as starting points of division are formed in the inside of the workpiece (see, for example, Japanese Patent No. 3408805), and those of a type in which a laser beam of such a wavelength as to be transmitted through a workpiece is applied to the workpiece, with a focal point of the laser beam positioned in the inside of the workpiece, whereby a plurality of shield tunnels each including a minute hole extending from a front surface to a back surface of the workpiece and serving as a starting point of division and an amorphous region surrounding the minute hole are formed (see, for example, Japanese Patent Laid-open No. 2014-221483). One of these types of the laser processing apparatuses is appropriately selected according to the kind of the workpiece, processing accuracy and the like factors.

Of the above-mentioned laser processing apparatuses, that of the type of performing ablation particularly has a problem that debris (laser processing swarf) generated upon application of the laser beam to the front surface of the wafer may scatter and adhere to the surfaces of the devices formed on the wafer, thereby lowering the quality of the devices. To overcome this problem, there has been proposed a technology in which a liquid resin permitting transmission therethrough of the laser beam used for processing is applied to the front surface of the wafer before performing the laser processing, to thereby prevent adhesion of debris, and the liquid resin is removed after performing the laser processing (see, for example, Japanese Patent Laid-open No. 2004-188475).

SUMMARY OF THE INVENTION

According to the technology described in Japanese Patent Laid-open No. 2004-188475, the coating with the liquid resin makes it possible to prevent debris from adhering to the surfaces of the devices, whereby processing quality is secured. However, this technology needs the step of applying the liquid resin and the step of removing the liquid resin after the processing, and has a problem as to productivity. Further, since the liquid resin cannot be utilized repeatedly, the technology is uneconomical.

There has also been proposed a technology in which application of a laser beam is conducted with a wafer immersed in water, to cause debris to float in the water, whereby adhesion of the debris to the surface of the wafer is prevented. In the case where the laser beam is applied to the wafer with the wafer immersed in water, however, minute bubbles are generated from the part of the wafer to which the laser beam is applied, leading to a problem that the propagation of the laser beam is obstructed by the bubbles, and desired processing cannot be achieved.

It is therefore an object of the present invention to provide a laser processing apparatus by which a laser beam can be applied to a plate-shaped workpiece to process the workpiece, while preventing the application of the laser beam to the workpiece from being obstructed.

In accordance with an aspect of the present invention, there is provided a laser processing apparatus including: a holding unit including a holding table adapted to hold a plate-shaped workpiece; a laser beam applying unit adapted to apply a laser beam to the workpiece held by the holding table to process the workpiece; and a liquid supply mechanism disposed on the holding unit. The liquid supply mechanism includes: a pool adapted to form a layer of a liquid on an upper surface of the workpiece held by the holding table; a transparent plate disposed such as to make contact with the layer of the liquid; a jet nozzle adapted to jet the liquid toward an application position of the laser beam applied to the workpiece through the transparent plate; a liquid supply nozzle adapted to supply the liquid from one side of the pool; and a liquid discharge nozzle adapted to discharge the liquid from the other side of the pool.

Preferably, the laser beam applying unit includes dispersing means dispersing the laser beam emitted from a laser oscillator.

According to the present invention, a laser processing apparatus is provided, in which application of a laser beam to a workpiece is not obstructed. Particularly, in the case where the present invention is applied to a laser processing apparatus that performs ablation, adhesion of debris generated at the time of laser processing to devices can be restrained, and processing quality of the devices is prevented from being lowered, without coating the front surface of the wafer with a liquid resin.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
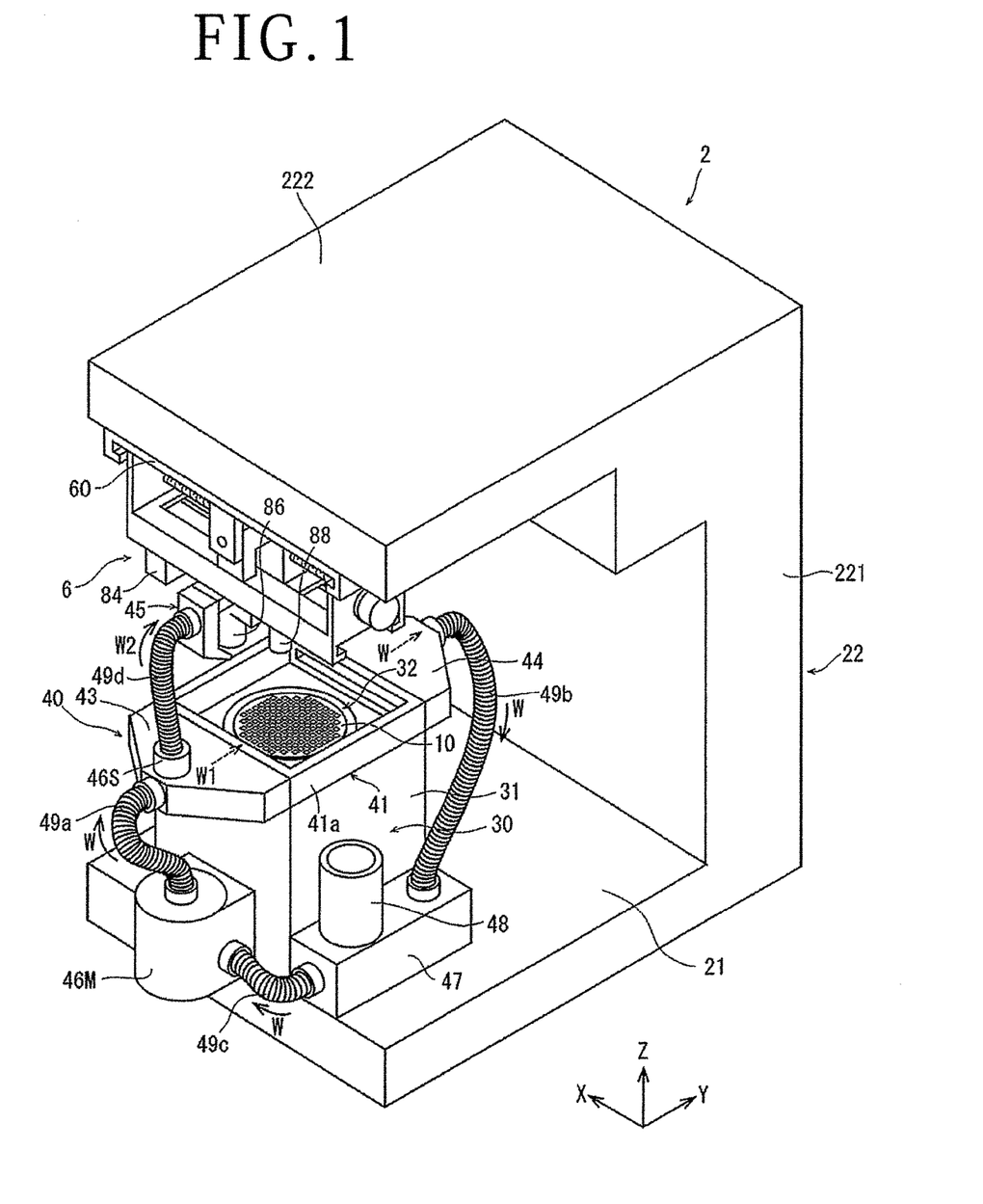
FIG. 1 is a perspective view of a laser processing apparatus according to an embodiment of the present invention.

A laser processing apparatus according to an embodiment of the present invention will be described below, referring to the attached drawings. FIG. 1 is a perspective view of a laser processing apparatus 2 according to an embodiment of the present invention. The laser processing apparatus 2 includes: a base 21; a holding unit 30 disposed on the base 21 to hold a workpiece; a frame body 22 including a vertical wall section 221 erected in a Z-direction indicated by arrow Z on a lateral side of the holding unit 30 on the base 21, and a horizontal wall section 222 extending in a horizontal direction from an upper end portion of the vertical wall section 221; a liquid supply mechanism 40 disposed at an upper portion of the holding unit 30; and a laser beam applying unit 6 disposed on a lower surface of the horizontal wall section 222.

Figure 2:
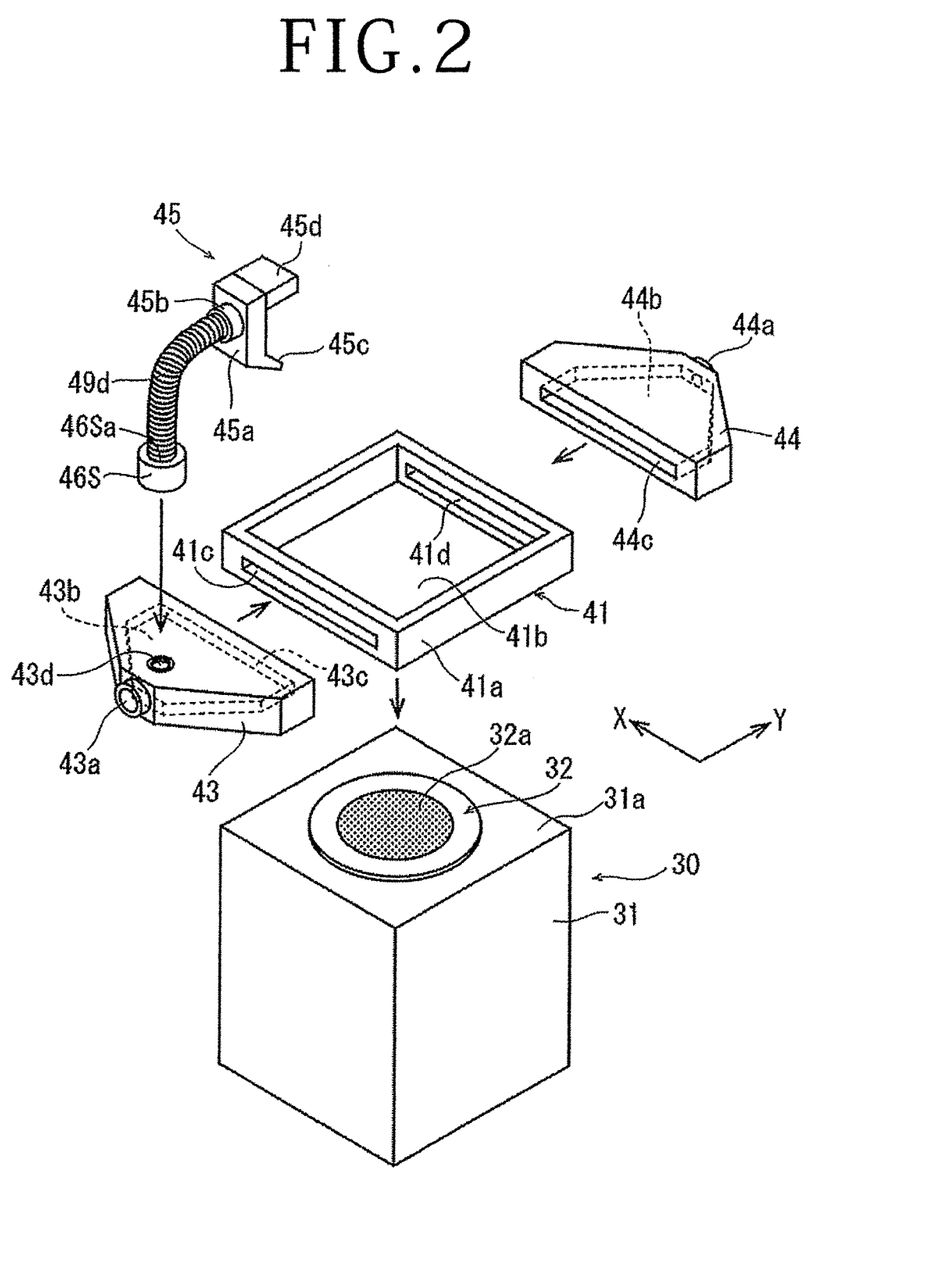
FIG. 2 is a partial exploded view of a pool constituting a liquid supply mechanism, and a holding unit, of the laser processing apparatus illustrated in FIG. 1.

FIG. 2 is a figure illustrating each of components of the holding unit 30 as well as a pool 41, a liquid supply nozzle 43, a liquid discharge nozzle 44 and a jet nozzle 45 which constitute part of the liquid supply mechanism 40, in a dismantled state. Each of the components will be described below.

The holding unit 30 includes: a holding base 31 having a rectangular parallelepiped shape and fixed on the base 21; and a circular holding table 32 disposed on an upper surface section 31a of the holding base 31. The holding table 32 is configured to be rotatable by a rotating mechanism (not illustrated). A central region of the holding table 32 includes a circular suction chuck 32a formed from a gas-permeable material, for example, a porous ceramic. The suction chuck 32a is connected to a suction source (not illustrated), and holds, by suction, a plate-shaped workpiece placed on the suction chuck 32a.

As illustrated in FIG. 2, a pool 41 which constitutes part of the liquid supply mechanism 40 is mounted on the upper surface section 31a of the holding base 31. The pool 41 includes a frame 41a constituting side surfaces surrounding a rectangular space 41b penetrating in the vertical direction, from four sides of an X-axis direction indicated by arrow X and a Y-axis direction indicated by arrow Y. Of the four side surfaces constituted by the frame 41a, one of the two side surfaces positioned to face each other in the Y-axis direction is provided with a liquid supply port 41c providing communication between the space 41b and the exterior, whereas the other of the two side surfaces is formed with a liquid discharge port 41d providing communication between the space 41b and the exterior. Preferably, the liquid supply port 41c and the liquid discharge port 41d extend in a horizontal direction in the side surfaces, and are formed in a size greater than the diameter of the suction chuck 32a.

As depicted in FIG. 2, a liquid supply nozzle 43 is connected to that side surface of the frame 41a at which the liquid supply port 41c is disposed. In addition, a liquid discharge nozzle 44 for discharging a liquid is connected to that side surface of the pool 41 at which the liquid discharge port 41d is disposed. Each of the liquid supply nozzle 43 and the liquid discharge nozzle 44 is formed such that it is substantially triangular in plan view shape and its thickness in the height direction is substantially equal to the thickness of the pool 41.

The liquid supply nozzle 43 is formed with a supply port 43a supplied with the liquid. The liquid supply nozzle 43 is formed therein with a passage 43b for guiding the liquid supplied from the supply port 43a to the liquid supply port 41c of the pool 41, as indicated by dotted lines, and that surface of the liquid supply nozzle 43 which faces the liquid supply port 41c is formed with a discharge port 43c in the same shape as the liquid supply port 41c. Further, an upper surface of the liquid supply nozzle 43 is formed with a branch port 43d. The branch port 43d communicates with the passage 43b formed in the inside of the liquid supply nozzle 43. The liquid supplied from the supply port 43a is led to the discharge port 43c and the branch port 43d through the passage 43b.

The liquid discharge nozzle 44 is configured to be the same as the liquid supply nozzle 43 in shape, except that the branch port 43d is not formed therein. As illustrated in FIG. 2, the liquid discharge nozzle 44 is formed, at a position facing the liquid discharge port 41d of the pool 41, with a supply port 44c which is the same in shape as the liquid discharge port 41d of the pool 41. The liquid supplied from the supply port 44c is discharged from a discharge port 44c by passing through a passage 44b formed inside the liquid discharge nozzle 44. A packing (omitted in illustration) is disposed along the whole perimeter of edge portions of a lower surface of the frame body 41, and, when the pool 41 is mounted on the holding base 31, there is formed a space which includes the upper surface section 31a of the holding base 31 and is opened to the upper side.

A liquid supply sub-pump 46S is disposed at the branch port 43d of the liquid supply nozzle 43. A suction port (not illustrated) formed at a lower surface of the liquid supply sub-pump 46S is located in the passage 43b inside the liquid supply nozzle 43 through the branch port 43d. One side of a branch hose 49d composed of a resin-made flexible hose is connected to a discharge port 46Sa of the liquid supply sub-pump 46S. The other side of the branch hose 49d is connected to the jet nozzle 45.

The jet nozzle 45 includes a nozzle main body 45a, a supply port 45b to which the other side of the branch hose 49d is connected, and a coupling bracket 45d. The nozzle main body 45a is formed therein with a space, the liquid supplied from the supply port 45b is led through the space to a jet port 45c formed to be narrow as compared to the sectional area of the space, and is jetted from the jet port 45c set at a lower end portion of the nozzle main body 45a.

Figure 3:
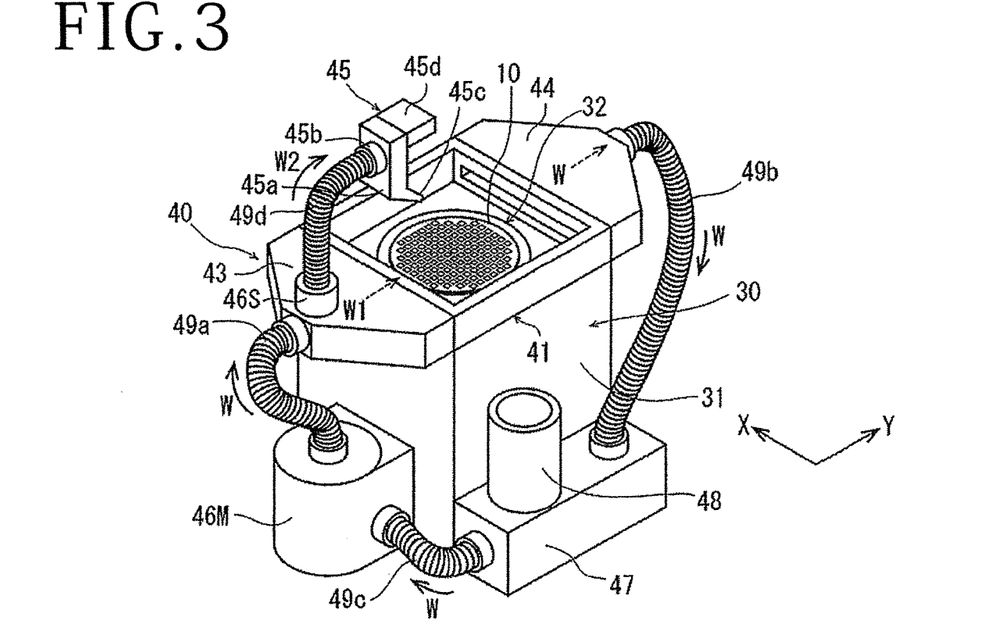
FIG. 3 is a perspective view illustrating the holding unit, liquid supply mechanism, and a peripheral configuration of the laser processing apparatus illustrated in FIG. 1.

Further, the liquid supply mechanism 40 and a peripheral configuration of the liquid supply mechanism 40 will be described. As illustrated in FIG. 3, the laser processing apparatus 2 in the present embodiment includes a liquid supply main pump 46M, a filter 47, and a liquid reserving tank 48, such that the liquid W is always supplied to the liquid supply mechanism 40. The liquid reserving tank 48 is disposed at the filter 47. The liquid supply main pump 46M and the liquid supply nozzle 43 are connected by a first hose 49a, while the liquid discharge nozzle 44 and the filter 47 are connected by a second hose 49b, and the filter 47 and the liquid supply main pump 46M are connected by a third pump 49c. Each of the hoses 49a to 49c is composed of a resin-made flexible hose, like the branch hose 49d.

According to the above configuration, the liquid W discharged from the liquid supply main pump 46M is supplied to the liquid supply nozzle 43 through the first hose 49a. With the liquid supply sub-pump 46S disposed at the liquid supply nozzle 43 as above-mentioned, the liquid W supplied to the liquid supply nozzle 43 is branched into a liquid W1 flowing directly from the liquid supply nozzle 43 to the pool 41, and a liquid W2 discharged from the liquid supply sub-pump 46S and supplied to the jet nozzle 45. The liquid W2 supplied to the jet nozzle 45 is jetted from the jet port 45c of the jet nozzle 45 into the pool 41 and is joined with the liquid W1, to be the liquid W, and the liquid W supplied to the pool 41 is discharged through the liquid discharge nozzle 44. Further, the liquid W discharged from the liquid discharge nozzle 44 is led through the second hose 49b to the filter 47, to be filtered thereby, and is returned through the third hose 49c to the liquid supply main pump 46M. Note that the manner in which the liquid W2 is jetted from the jet port 45c of the jet nozzle 45 into the pool 41, will be described in detail later.

In the liquid supply mechanism 40 in the present embodiment, the liquid is permitted to gradually leak through, for example, a gap between the pool 41 and a mating surface formed at an upper surface of the holding base 31, and, since the upper side of the pool 41 is open, the liquid W is supposed to overflow to the exterior. It is preferable to provide a recovery passage for recovering the liquid W having leaked to the exterior of the pool 41 or having overflowed from the pool 41, on the base 21, and for recirculating the liquid W to the filter 47. In addition, in the case where the amount of the liquid W is decreased due to such leakage or the like, the liquid reserving tank 48 may be appropriately replenished with the liquid. Note that the liquid reserving tank 48 is connected directly to the filter 47, and also has a function of discharging bubbles contained in the liquid W led to the filter 47.

By the configuration as above, the liquid W is circulated in the liquid supply mechanism 40. The flow velocity of the liquid W flowing within the liquid supply mechanism 40 can be controlled by regulating the pressure feeding efficiency of the liquid supply main pump 46M, regulating the internal volume of the pool 41, or regulating the opening areas of the liquid supply port 41c and the liquid discharge port 41d, and is controlled to a predetermined flow velocity.

Figure 4:
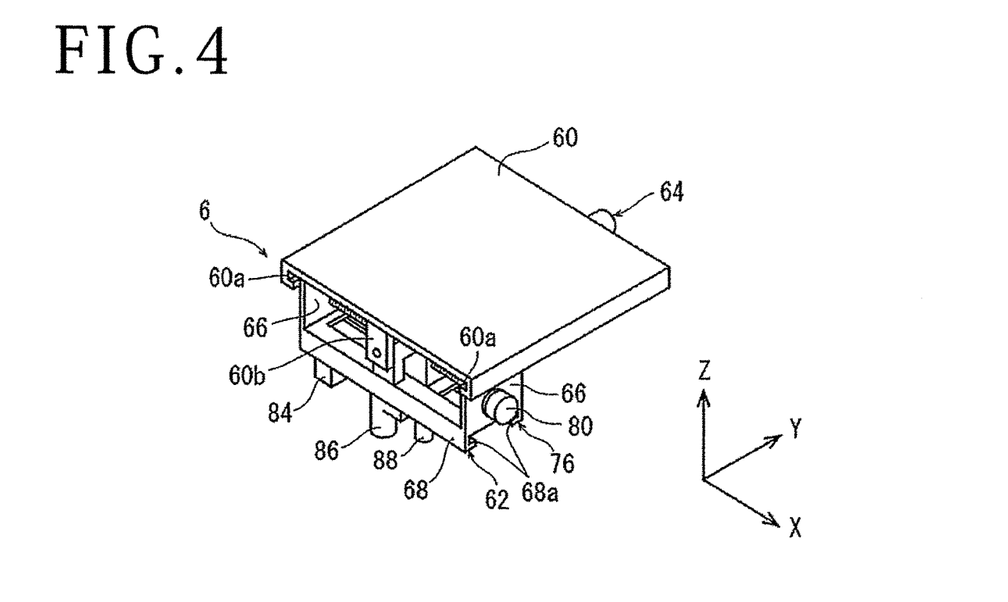
FIG. 4 is a perspective view of a laser beam applying unit of the laser processing apparatus illustrated in FIG. 1.
Figure 5:
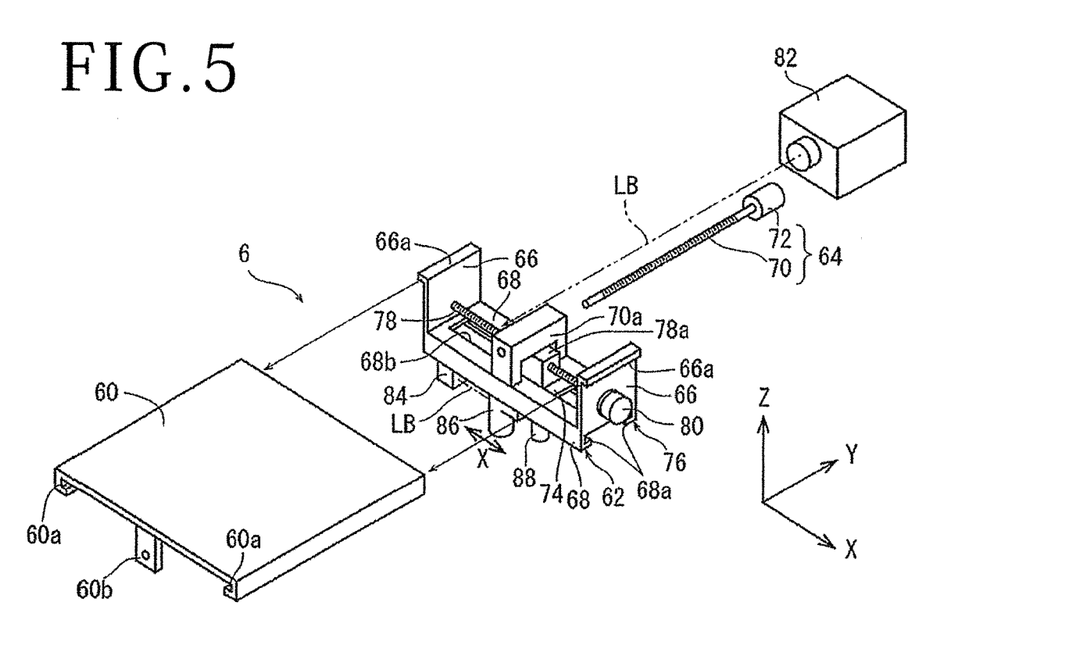
FIG. 5 is an exploded perspective view of the laser beam applying unit illustrated in FIG. 4.

Referring to FIGS. 1, 4 and 5, the laser beam applying unit 6 will be described below. Note that FIG. 5 is an exploded perspective view of the laser beam applying unit 6 illustrated in FIG. 4.

The laser beam applying unit 6 includes: a guide plate 60 fixed to a lower surface of the horizontal wall section 222 of the frame body 22 by fixing means (not illustrated); a Y-axis direction movable member 62 supported by the guide plate 60 such as to be movable in the Y-axis direction; and a Y-axis direction moving mechanism 64 adapted to move the Y-axis direction movable member 62 in the Y-axis direction. A pair of guide rails 60a extending in the Y-axis direction are formed at lower portions of both ends in regard of the X-axis direction of the guide plate 60. As depicted in FIGS. 4 and 5, the Y-axis direction movable member 62 includes a pair of guided sections 66 disposed with a spacing therebetween in the X-axis direction, and a mounting section 68 arranged between lower ends of the guided sections 66 and extending in the X-axis direction. Guided rails 66a extending in the Y-axis direction are formed at upper portions of the guided sections 66. The guided rails 66a of the guided sections 66 and the guide rails 60a of the guide plate 60 are engaged with each other, whereby the Y-axis direction movable member 62 is supported by the guide plate 60 such as to be movable in the Y-axis direction. In addition, a pair of guide rails 68a extending in the X-axis direction are formed at lower portions of both ends in regard of the Y-axis direction of the mounting section 68. The Y-axis direction moving mechanism 64 includes a ball screw 70 extending in the Y-axis direction under the guide plate 60, and a motor 72 connected to one end portion of the ball screw 70. A gate-shaped nut section 70a of the ball screw 70 is fixed to an upper surface of the mounting section 68. The other end portion of the ball screw 70 to which the motor 72 is not connected is screw engaged with the nut section 70a, and is then rotatably supported by a support piece section 60b formed at a front edge portion of the guide plate 60. The Y-axis direction moving mechanism 64 converts a rotational motion of the motor 72 into a rectilinear motion, and transmits the rectilinear motion to the Y-axis direction movable member 62, by the ball screw 70, and thereby moves the Y-axis direction movable member 62 in the Y-axis direction along the guide rails 60a of the guide plate 60.

Referring to FIG. 5, the description of the laser beam applying unit 6 will be continued. The laser beam applying unit 6 further includes: an X-axis direction movable plate 74 mounted to the mounting section 68 of the Y-axis direction movable member 62 such as to be movable in the X-axis direction; and an X-axis direction moving mechanism 76 adapted to move the X-axis direction movable plate 74 in the X-axis direction. Both end portions in regard of the Y-axis direction of the X-axis direction movable plate 74 and the guide rails 68a of the mounting section 68 are engaged with each other, whereby the X-axis direction movable plate 74 is mounted to the mounting section 68 such as to be movable in the X-axis direction. The X-axis direction moving mechanism 76 includes a ball screw 78 extending in the X-axis direction on the upper side of the mounting section 68, and a motor 80 connected to one end portion of the ball screw 78 and supported by one of the guided sections 66. A nut section 78a of the ball screw 78 is passed through an opening 68b in the mounting section 68, and is fixed to an upper surface of the X-axis direction movable plate 74. The other end portion of the ball screw 78 to which the motor 80 is not connected is rotatably supported by the other of the guided sections 66 where the motor 80 is not fixed. The X-axis direction moving mechanism 76 converts a rotational motion of the motor 80 into a rectilinear motion, and transmits the rectilinear motion to the X-axis direction movable plate 74, by the ball screw 78, and thereby moves the X-axis direction movable plate 74 in the X-axis direction along the guide rails 68a of the mounting section 68.

Figure 6:
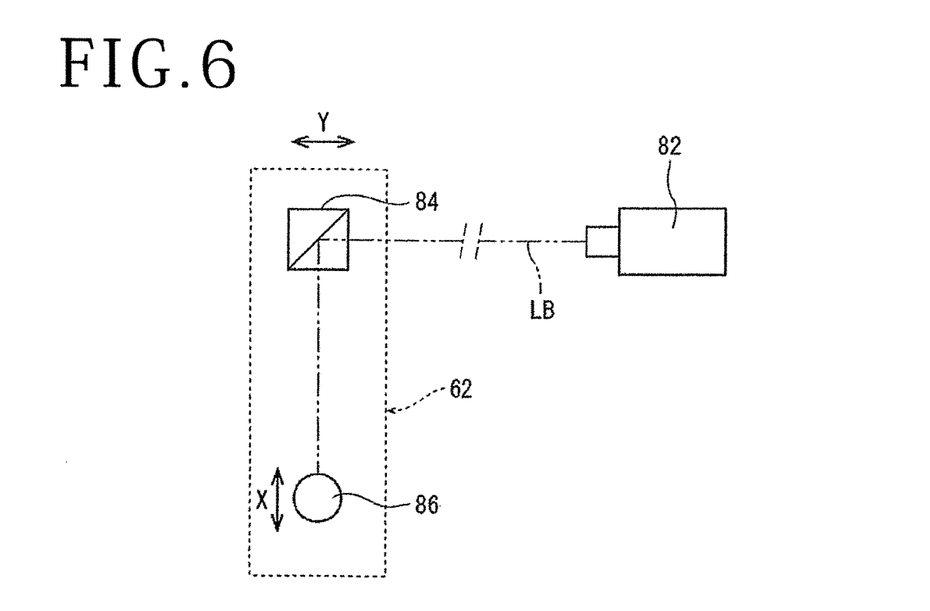
FIG. 6 is a block diagram illustrating an optical system of the laser beam applying unit illustrated in FIG. 4.

Referring to FIGS. 5 to 8, further, the configuration of an optical system of the laser beam applying unit 6 will be described. As illustrated in FIG. 5, the laser beam applying unit 6 includes: a laser oscillator 82 adapted to emit a pulsed laser beam LB; an attenuator (omitted in illustration) adapted to control the output of the laser beam LB emitted from the laser oscillator 82; a rectangular prism mirror 84 mounted to a lower surface of the mounting section 68 of the Y-axis direction movable member 62 with a spacing from the laser oscillator 82 in the Y-axis direction; a condenser 86 mounted to a lower surface of the X-axis direction movable plate 74 such as to be movable in the Z-axis direction; and focal point position control means (omitted in illustration) adapted to move the condenser 86 in the Z-axis direction to control the position in the Z-axis direction of a focal point of the condenser 86. The laser oscillator 82 emits, for example, a laser beam LB of such a wavelength (for example, 355 nm) as to be absorbed in the workpiece. As depicted in FIG. 6, the laser beam LB applied in the Y-axis direction from the laser oscillator 82 has its propagation direction changed by 90 degrees by the rectangular prism mirror 84, before being incident on the condenser 86.

Figure 7A:
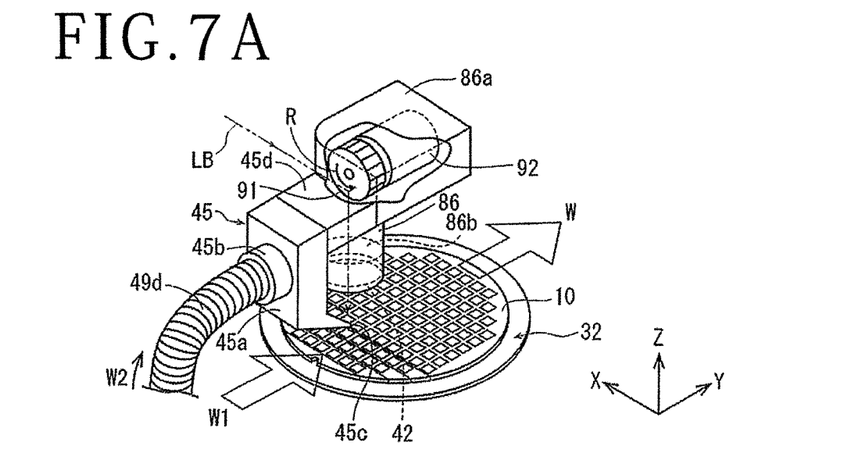
FIG. 7A is a perspective view illustrating a state in which laser processing is performed by the laser beam applying unit illustrated in FIG. 5.
Figure 7B:
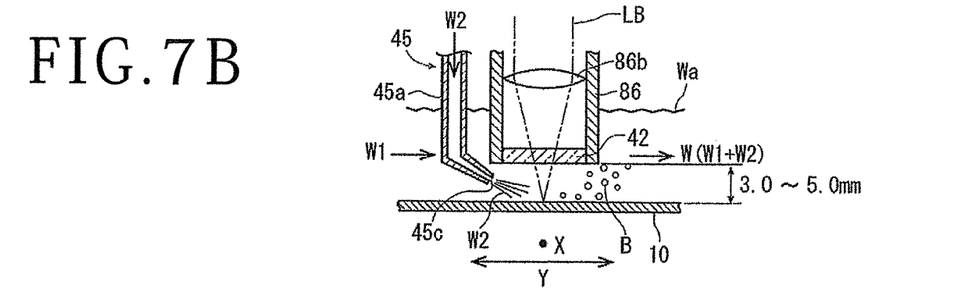
FIG. 7B is a partial enlarged sectional view of the state in which the laser processing is performed.
Figure 8:
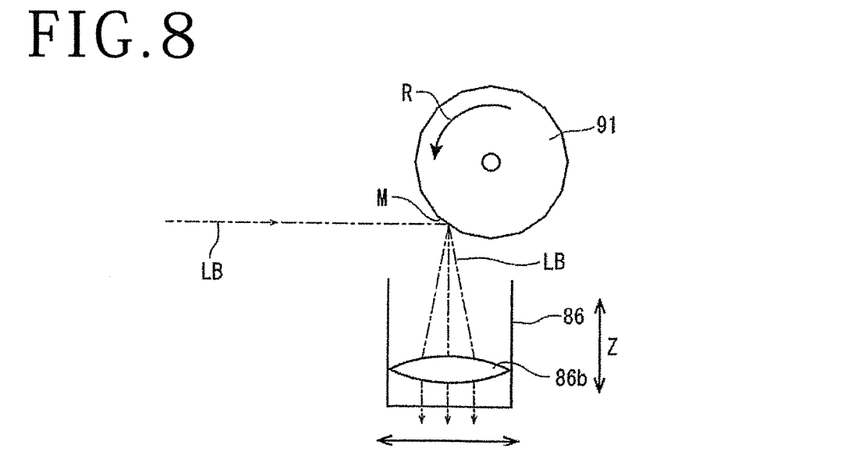
FIG. 8 is a side view generally illustrating the laser beam applying unit explaining a state in which the laser processing illustrated in FIG. 7A is performed.

FIG. 7A is a figure illustrating, in an enlarged form, a major part in a mode of subjecting a wafer 10 held by the holding table 32 to laser processing by the laser processing apparatus 2 according to the present embodiment. The jet nozzle 45 is connected to an upper housing 86a of the condenser 86 through the coupling bracket 45d. In the inside depicted by cutting out part of the housing 86a of the condenser 86, there are provided: a polygon mirror 91 as dispersing means dispersing the laser beam LB emitted from the laser oscillator 82; a motor 92 adapted to rotate the polygon mirror 91 at a high speed in a direction indicated by arrow R; and a focusing lens (fθ lens) 86b adapted to focus the laser beam LB and thereby to apply the laser beam to the workpiece. Under the focusing lens 86b and at a lower end of the housing 86a, a transparent plate 42 is disposed such as to hermetically close a lower end portion of the housing 86a (refer to FIG. 7B as well). As depicted in FIG. 8, the polygon mirror 91 has a plurality of sheets of mirrors M disposed concentrically with respect to a rotational axis of the polygon mirror 91. The fθ lens 86b is located under the polygon mirror 91, and is adapted to focus the laser beam LB, thereby applying the laser beam LB to the workpiece on the holding table 32. The laser beam LB guided from the rectangular prism mirror 84 is guided to the fθ lens 86b in such a manner that its application direction is dispersed in the X-axis direction by the rotating mirrors M, whereby the laser beam LB is applied while being dispersed in a predetermined range in the X-axis direction on the workpiece. The above-mentioned transparent plate 42 is formed from a glass through which the laser beam LB is transmitted, but this is not restrictive; the transparent plate 42 may be a transparent member made of a resin such as an acrylic resin.

Returning to FIG. 5 for continuing the description, an alignment unit 88 mounted with a spacing from the condenser 86 in the X-axis direction is disposed, together with the condenser 86, on a lower surface of the X-axis direction movable plate 74. The alignment unit 88 is configured to image the workpiece held by the holding table 32 to detect a region to be laser processed. Further, the laser beam applying unit 6 is provided with the focal point position control means (not illustrated). While illustration of a specific configuration of the focal point position control means is omitted, the configuration may include a ball screw of which a nut section is fixed to the condenser 86 and which extends in the Z-axis direction, and a motor connected to one end portion of the ball screw. By such a configuration, a rotational motion of the motor is converted into a rectilinear motion, and the condenser 86 is moved along guide rails (omitted in illustration) disposed in the Z-axis direction, whereby the position in the Z-axis direction of the focal point of the laser beam LB condensed by the condenser 86 is controlled. As above-mentioned, the jet nozzle 45 is coupled to the condenser 86. Therefore, when the condenser 86 is moved by the focal point position control means, the jet nozzle 45 also is thereby moved in the Z-axis direction together with the condenser 86.

The laser processing apparatus 2 of the present invention is generally configured as above-mentioned, and an operation thereof will be described below. First, the wafer 10 as the plate-shaped workpiece in the present embodiment is prepared. The wafer 10 is formed from silicon (Si) and is formed with a plurality of apparatus on a front surface thereof. After the wafer 10 is prepared, the wafer 10 is placed on the holding table 32 of the holding unit 30 from above the pool 41 illustrated in FIG. 1, with its front surface formed with the devices being on the upper side. After the wafer 10 is place on the holding table 32, the suction source (not illustrated) is operated to generate a suction force at the suction chuck 32a forming the central region of the holding table 32, whereby the wafer 10 is held by suction.

After the wafer 10 is held on the holding table 32, the X-axis direction movable plate 74 is moved by the X-axis direction moving mechanism 76 of the laser beam applying unit 6, and the Y-axis direction movable member 62 is moved in the Y-axis direction by the Y-axis direction moving mechanism 64 (see FIGS. 4 and 5), whereby the alignment unit 88 is positioned at a position on the upper side of the pool 41. The alignment unit 88 can get a picture of the whole region inclusive of the devices on the wafer 10. After the alignment unit 88 is positioned on the upper side of the wafer 10, a division line serving as a processing position on the wafer 10 is imaged by the alignment unit 88. Next, based on an image of the wafer 10 picked up by the alignment unit 88, alignment between the division line on the wafer 10 and the condenser 86 is conducted. After the alignment, the holding table 32 is rotated, the X-axis direction movable plate 74 is moved by the X-axis direction moving mechanism 76, and the Y-axis direction movable member 62 is moved by the Y-axis direction moving mechanism 64, whereby a predetermined one of the division lines formed in a grid pattern on the wafer 10 is positioned along the X-axis direction, and the condenser 86 is positioned at one end portion of the predetermined division line, or a starting position of application of the laser beam. Next, the condenser 86 is moved in the Z-axis direction by the focal point position control means (not illustrated), whereby the focal point is positioned at a surface level of the one end portion of the predetermined division line on the wafer 10.

After the condenser 86 is positioned at the starting position of application of the laser beam, as above-mentioned, the liquid reserving tank 48 is sufficiently replenished with the liquid W, and the liquid supply main pump 46M is operated, to start discharge of the liquid W. As the liquid W circulated in the inside of the liquid supply mechanism 40, there is used, for example, pure water.

With the lapse of a predetermined time after the start of an operation of the liquid supply main pump 46M, the space 41b of the pool 41 is filled with the liquid W to a predetermined height position, whereby a state results in which a layer of the liquid W is formed and the liquid W is stably circulated in the inside of the liquid supply mechanism 40. In this instance, as depicted in FIG. 7B, the liquid surface Wa of the layer of the liquid W filling the space 41b of the pool 41 is above the positions of the transparent plate 42 at the lower end of the condenser 86 and the jet port 45c of the jet nozzle 45. As a result, at least the transparent plate 42 is constantly immersed in the layer of the liquid W, and kept in contact with the liquid W. Note that the gap from the transparent plate 42 to the front surface of the wafer 10 is set to a value of 3.0 to 5.0 mm.

After the focal point position is positioned at the level of the front surface of the wafer 10 and the layer of the liquid W is formed in the pool 41, an operation of the liquid supply sub-pump 46S is started. With the operation of the liquid supply sub-pump 46S thus started, the liquid W2 is branched from the liquid supply nozzle 43 supplied with the liquid W, and is supplied through the branch hose 49d to the jet nozzle 45, as illustrated in FIG. 1.

The liquid W2 supplied to the jet nozzle 45 passes through the nozzle main body 45a, and is jetted into the liquid W1 flowing within the pool 41, as depicted in FIG. 7B. The position at which the liquid W2 is jetted from the jet port 45c is the position at which the laser beam LB is applied to the wafer W, and the liquid W2 is jetted downstream in regard of the flow indicated by arrow W1.

After the jetting of the liquid W2 from the jet nozzle 45 is started, the X-axis direction movable plate 74 is moved at a predetermined moving velocity in the X-axis direction by the X-axis direction moving mechanism 76, while operating the laser beam applying unit 6. In performing laser processing by applying the laser beam LB to the wafer 10, the polygon mirror 91 is rotated at an appropriate rotating speed by the motor 92, as has been described based on FIGS. 7A and 8. The positions of the mirrors M constituting the polygon mirror 91 vary attendant on the rotation of the polygon mirror 91, whereby the laser beam LB is applied to the wafer 10 while being dispersed. After the laser beam LB is applied to a predetermined mirror M, the laser beam LB is applied to a mirror M on the downstream side in regard of the rotating direction R of the polygon mirror 91, whereby the laser beam LB is applied to the wafer 10 in a dispersed manner. The direction of dispersion of the laser beam LB is the direction perpendicular to the paper surface of FIG. 7B, or the X-axis direction. While the laser beam LB is emitted from the laser oscillator 82 and the polygon mirror 91 is rotated, such laser processing is repeated. Note that the number of sheets of the mirrors M constituting the polygon mirror 91, the rotating speed of the polygon mirror 91, and the like factors are appropriately determined according to the workpiece.

Note that the laser processing by the laser processing apparatus 2 as above may be carried out, for example, in the following processing conditions.

Wavelength of laser beam: 226 nm, 355 nm, 532 nm, 1,064 nm
  Average output: 10 to 100 W
  Repetition frequency: 0 to 300 MHz
  Pulse width: 50 fs to 1 ns
  Processing feeding speed: 10 to 1,000 mm/s In the present embodiment, the pool 41 of the liquid supply mechanism 40 is placed on the holding table 32, and, as seen from FIGS. 7A and 7B, the liquid W2 jetted from the jet port 45c of the jet nozzle 45 constantly flows in the Y-axis direction orthogonal to the X-axis direction that is the processing feeding direction, together with the liquid W1 supplied from the liquid supply nozzle 43 (note that in FIGS. 7A and 7B, the pool 41 is omitted for convenience of explanation). In this state, the laser beam LB is applied to the division line on the wafer 10 through the transparent plate 42 disposed at the condenser 86 and the liquid W (W1+W2), whereby ablation is performed.

As above-mentioned, when ablation is applied to the front surface of the wafer 10, bubbles B are thereby generated in the liquid W located at the position where the laser beam LB is applied. In the present embodiment, since the liquid W2 is jetted from the jet nozzle 45 to the gap formed between the wafer 10 and the transparent plate 42 (see FIG. 7B), the bubbles B generated in the vicinity of the application position of the laser beam LB are swiftly flowed away to the downstream side of the pool 41. As a result, in the case where the laser beam LB is applied to the wafer 10 in a dispersed manner by the polygon mirror 91, the laser beam LB can be applied to the wafer 10 while avoiding the bubbles B generated due to ablation, so that favorable ablation can be carried out continuedly. Further, according to the present embodiment, even when debris is generated due to ablation, the continued flow of the liquid W within the pool 41 causes the debris released into the liquid W to be swiftly removed from the pool 41. Since the debris released into the liquid W is trapped by the filter 47, the debris is prevented from being again circulated into the pool 41.

After the ablation is carried out for the predetermined division line extending in the first direction, the Y-axis direction movable member 62 is moved in the Y-axis direction by the Y-axis direction moving mechanism 64, to position the condenser 86 at one end portion of an unprocessed division line adjacent to the just-processed division line, and the same laser processing as the above-mentioned ablation is conducted. After the ablation is performed for all the division lines extending in the first direction, the holding table 32 is rotated by 90 degrees, and the same ablation is thereby performed also for the division lines extending in the second direction orthogonal to the division lines extending in the first direction. In this way, ablation can be carried out for all the division lines on the wafer 10.

As above-mentioned, the space 41b surrounded by the pool 41 is formed on the holding table 32, and at least the upper side of the holding table 32 is covered by the layer of the liquid W. The liquid W2 is jetted by the jet nozzle 45 to the application position of the laser beam LB in the gap between the transparent plate 42 and the wafer 10, and laser processing is conducted. As a result, the bubbles B generated from the front surface of the wafer 10, the debris generated due to laser processing, and the like are swiftly removed, so that they are prevented from obstructing the laser processing; in addition, adhesion of the debris to devices after processing and the like troubles are prevented, whereby processing quality is prevented from being lowered.

In the above embodiment, an example has been presented in which the laser beam LB emitted from the laser oscillator 82 is led to the focusing lens 86b while being dispersed by the polygon mirror 91, but this is not restrictive. A reflection mirror or mirrors disposed fixedly may be used in place of the polygon mirror 91. Further, while an example in which the laser processing applied to the wafer 10 is ablation has been presented in the above embodiment, the laser processing may be a processing of forming modified layers in the inside of a workpiece (for example, the laser processing described in Japanese Patent No. 3408805) or a processing of forming so-called shield tunnels (for example, the laser processing described in Japanese Patent Laid-open No. 2014-221483).

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A laser processing apparatus comprising:
  a holding unit including a holding table adapted to hold a plate-shaped workpiece;
  a laser beam applying unit adapted to apply a laser beam to the workpiece held by the holding table to process the workpiece; and
  a liquid supply mechanism disposed on the holding unit, wherein the liquid supply mechanism includes:
    a pool adapted to form a layer of a liquid on an upper surface of the workpiece held by the holding table;
    a transparent plate disposed such as to make contact with the layer of the liquid;

a jet nozzle adapted to jet the liquid toward an application position of the laser beam applied to the workpiece through the transparent plate;
a liquid supply nozzle adapted to supply the liquid from one side of the pool; and
a liquid discharge nozzle adapted to discharge the liquid from other side of the pool.

2. The laser processing apparatus according to claim 1, wherein the laser beam applying unit includes dispersing means dispersing the laser beam emitted from a laser oscillator.

\* \* \* \* \*